United States Patent
Redfern et al.

(10) Patent No.: US 8,441,380 B2
(45) Date of Patent: May 14, 2013

(54) METHOD AND APPARATUS FOR PERFORMING DATA CONVERSION WITH NON-UNIFORM QUANTIZATION

(75) Inventors: Arthur J. Redfern, Plano, TX (US); Patrick Satarzadeh, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 13/112,925

(22) Filed: May 20, 2011

(65) Prior Publication Data
US 2012/0293350 A1 Nov. 22, 2012

(51) Int. Cl.
H03M 1/00 (2006.01)

(52) U.S. Cl.
USPC .......................... 341/122; 341/155

(58) Field of Classification Search .......... 341/122, 341/123, 164, 155
See application file for complete search history.

(56) References Cited

U.S. PATENT DOCUMENTS

| | | | |
|---|---|---|---|
| 4,415,882 A | 11/1983 | Akazawa et al. | |
| 5,801,657 A | 9/1998 | Fowler et al. | |
| 6,271,782 B1 | 8/2001 | Steensgaard-Madsen | |
| 6,545,627 B1 | 4/2003 | He et al. | |
| 7,095,346 B2* | 8/2006 | Bogner | 341/120 |
| 7,859,441 B2 | 12/2010 | Kang | |
| 7,924,062 B2* | 4/2011 | Chiu | 327/94 |
| 7,961,132 B1* | 6/2011 | Perry et al. | 341/172 |
| 8,115,662 B2* | 2/2012 | Anthony | 341/122 |
| 2003/0169196 A1 | 9/2003 | Ono et al. | |
| 2011/0102217 A1 | 5/2011 | Hsu | |

OTHER PUBLICATIONS

A Design Technique for Nonuniform Quantizer in PCM Generation, IEEE Transactions on Circuits and Systems, vol. CAS-29, vol. 3, Mar. 1982, pp. 193-196 (K. Narayanasami and K. P. Rajappan).

"A Second Order Sigma Delta Modulator Using Semi-uniform Quantizer with 81dB Dynamic Range at 32x OSR," Proc. European Solid States Circuits Conference, Sep. 2002, pp. 579-582 (Bingxin Li and Hannu Tenhunen).

"Non-Uniform Error-Sampled Control System," Proc. of the 29th Conf. on Decision and Control, Dec. 1990, pp. 1888-1889 (Syed Murtuza).

"Design of Multi-bit Sigma-Delta Modulators for Digital Wireless Communications," Ph.D Dissertation 2003 (Bingxin Li).

PCT Search Report mailed Nov. 30, 2012.

* cited by examiner

*Primary Examiner* — Brian Young
(74) *Attorney, Agent, or Firm* — Alan A. R. Cooper; Wade J. Brady, III; Frederick J. Telecky, Jr.

(57) ABSTRACT

A method for converting a sampled analog signal into digital is provided. An input signal is sampled at a sampling instant to generate a sample voltage. A first current is then applied to a node to change a voltage on the node, and a first interval to change the voltage on the node to a reference voltage from the sample voltage using the first current is determined. A second current is then applied to the node to change a voltage on the node prior to a subsequent sampling instant, and a determination of a second interval to change the voltage on the node to the reference voltage from the sample voltage using the second current is made.

25 Claims, 6 Drawing Sheets

US 8,441,380 B2

METHOD AND APPARATUS FOR PERFORMING DATA CONVERSION WITH NON-UNIFORM QUANTIZATION

TECHNICAL FIELD

The invention relates generally to analog-to-digital converters (ADCs) and, more particularly, to non-uniform quantizers within ADCs.

BACKGROUND

Quantization is generally part of the functionality of an ADC, and most quantizers used in ADCs are linear. For example, many flash ADCs employs a resistor divider that divides a supply voltage evenly to generate several reference voltages that are equidistantly spaced apart. However, there are some conventional ADCs which have quantizers that are non-uniform, such as the ADC 100. As shown, ADC 100 generally comprises a sample-and-hold (S/H) circuit 102 and a non-uniform quantizer 104 (which includes a divider having resistors R1 to R8 and comparators 106-1 to 106-7). The resistors R1 to R8 have differing resistances (i.e., R to 5*R) so that the reference voltages applied to comparators 106-1 to 106-7 are non-uniformly spaced. These conventional ADCs, however, have many issues (i.e., high power consumption, low accuracy, etc.). Therefore, there is a need for an improved ADC architecture that employs non-uniform quantization.

Some other conventional circuits are: U.S. Pat. Nos. 5,801,657; 6,271,782; 7,859,441; Narayanasami et al. "A Design Technique for Nonuniform Quantizer in PCM Generation" *IEEE Transactions on Circuits and Systems*, Vol. CAS-29, Vol. 3, March 1982; Li et al., "A Second Order Sigma Delta Modulator Using Semi-uniform Quantizer with 81 dB Dynamic Range at 32×OSR," *Proc. Europrean Solide States Circuits Conference*, pp. 579-582, September 2002; Syed Murtuza, "Non-Uniform Error-Sampled Control Systems," *Proc. of the 29$^{th}$ Conf. on Decision and Control*, December 1990; and Bingxin Li, "Design of Multi-bit Sigma-Delta Modulators for Digital Wireless Communications," Ph.D Dissertation, 2003.

SUMMARY

An embodiment of the present invention, accordingly, provides an apparatus. The apparatus comprises a sample-and-hold (S/H) circuit that is configured to generate a sample voltage from an input signal, wherein the S/H circuit is controlled by a sample clock signal; a digital-to-analog converter (DAC) that is coupled to an output terminal of the S/H circuit so as to apply at least one of a plurality of applied currents to the output terminal of the S/H circuit; a comparator that is coupled to the output terminal and that receives a reference voltage; a counter that is configured to determine the length of a first interval over which a first voltage on an output terminal of the S/H circuit changes from the sample voltage to the reference voltage using a first applied current of the plurality of applied currents from the DAC; and a controller that is coupled to the comparator, the DAC, the counter, and the S/H circuit, wherein the controller provides the sample clock signal to the S/H circuit, and wherein the controller provides a clock signal to the counter, and wherein the controller is configured to adjust the DAC to provide a second applied current after the first voltage on the output terminal of the S/H circuit reaches the reference voltage, and wherein the counter, during a sample period of the sample clock associated with the sample voltage, is configured to determine the length of a second interval over which a second voltage on the output terminal of the S/H circuit changes from the sample voltage to the reference voltage using the second applied current of the plurality of applied currents from the DAC.

In accordance with an embodiment of the invention, the S/H circuit further comprises a plurality of sampling branches, wherein each sampling branch is coupled to the output terminal of the S/H circuit, is controlled by a sample control signal from the controller, and has a sampling capacitor.

In accordance with an embodiment of the invention, the DAC further comprises: a plurality of switches, wherein each switch is coupled to the output terminal of the S/H circuit, and wherein each switch is controlled by the controller; and a plurality of current sources, wherein each current source is coupled to at least one of the switches.

In accordance with an embodiment of the invention, the plurality of current sources are configured to discharge the sampling capacitors.

In accordance with an embodiment of the invention, the plurality of current sources are configured to charge the sampling capacitors.

In accordance with an embodiment of the invention, the apparatus further comprises a output circuit that is coupled to the controller.

In accordance with an embodiment of the invention, the controller provides the clock signal to the comparator.

In accordance with an embodiment of the invention, an apparatus is provided. The apparatus comprises an S/H circuit that is configured to generate a plurality of sample voltages from input signal at a plurality of sampling instants, wherein the S/H circuit is controlled by a sample clock signal; a DAC that is coupled to an output terminal of the S/H circuit so as to apply at least one of a plurality of currents to the output terminal of the S/H circuit; a comparator that is coupled to the output terminal and that receives a reference voltage; a counter that is configured to determine the lengths of intervals over which voltages on an output terminal of the S/H circuit change to the reference voltage from each sample voltage; and a controller that is coupled to the comparator, the DAC, the counter, and the S/H circuit, and wherein the controller provides a clock signal to the counter, and wherein the controller is configured to adjust the reference voltage for a subsequent sample voltage based at least in part on a current sample voltage.

In accordance with an embodiment of the invention, the DAC further comprises a first DAC, and wherein the apparatus further comprises a second DAC that is coupled between the controller and the comparator and that provides the reference voltage to the comparator.

In accordance with an embodiment of the invention, the S/H circuit further comprises a sampling capacitor.

In accordance with an embodiment of the invention, the first DAC further comprises: a plurality of switches, wherein each switch is coupled to the output terminal of the S/H circuit, and wherein each switch is controlled by the controller; and a plurality of current sources, wherein each current source is coupled to at least one of the switches.

In accordance with an embodiment of the invention, the plurality of current sources are configured to discharge the sampling capacitor.

In accordance with an embodiment of the invention, the plurality of current sources are configured to charge the sampling capacitor.

In accordance with an embodiment of the invention, the controller adjusts the reference voltage for a subsequent sample voltage based at least in part on a slope of the two previous sample voltages.

In accordance with an embodiment of the invention, a method is provided. The method comprises sampling an input signal at a sampling instant to generate a sample voltage; applying a first current to a node to change a voltage on the node; determining a first interval to change the voltage on the node to a reference voltage from the sample voltage using the first current; applying a second current to the node to change a voltage on the node prior to a subsequent sampling instant; and determining a second interval to change the voltage on the node to the reference voltage from the sample voltage using the second current.

In accordance with an embodiment of the invention, the method further comprises: storing the sample voltage on a first and second capacitors; coupling the first capacitor to the node prior to the step of applying the first current; and coupling the second capacitor the node prior to the step of applying the second current.

In accordance with an embodiment of the invention, the step of determining the first interval further comprises incrementing a first count value using a clock signal until the voltage on the node reaches the reference voltage, and wherein the step of determining the second interval further comprises incrementing a second count value using the clock signal until the voltage on the node reaches the reference voltage.

In accordance with an embodiment of the invention, the method further comprises: converting the second count value to a digital representation of the sample voltage if the voltage on the node reaches the reference voltage using the second current before a subsequent sampling instant; and converting the first count value to the digital representation of the sample voltage if the voltage on the node does not reach the reference voltage using the second current before the subsequent sample.

In accordance with an embodiment of the invention, the first and second currents discharge the first and second capacitors to the reference voltage, respectively.

In accordance with an embodiment of the invention, the first and second currents charge the first and second capacitors to the reference voltage, respectively.

In accordance with an embodiment of the invention, a method is provided. The method comprises sampling an input signal at a sampling instant to generate a sample voltage; applying a current to a node to change a voltage on the node; determining an interval to change the voltage on the node to a reference voltage from the sample voltage using the current; and adjusting the reference voltage for a subsequent sample based at least in part on the interval.

In accordance with an embodiment of the invention, the method further comprises: storing the sample voltage on a capacitor; and coupling the capacitor to the node prior to the step of applying the current.

In accordance with an embodiment of the invention, the step of determining the interval further comprises incrementing a first count value using a clock signal until the voltage on the node reaches the reference voltage.

In accordance with an embodiment of the invention, the method further comprises converting the count value to a digital representation of the sample voltage.

In accordance with an embodiment of the invention, the step of adjusting further comprises: calculating a slope between the sample voltage and a previous sample; and adjusting the reference voltage for the subsequent sample based at least in part on the slope.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
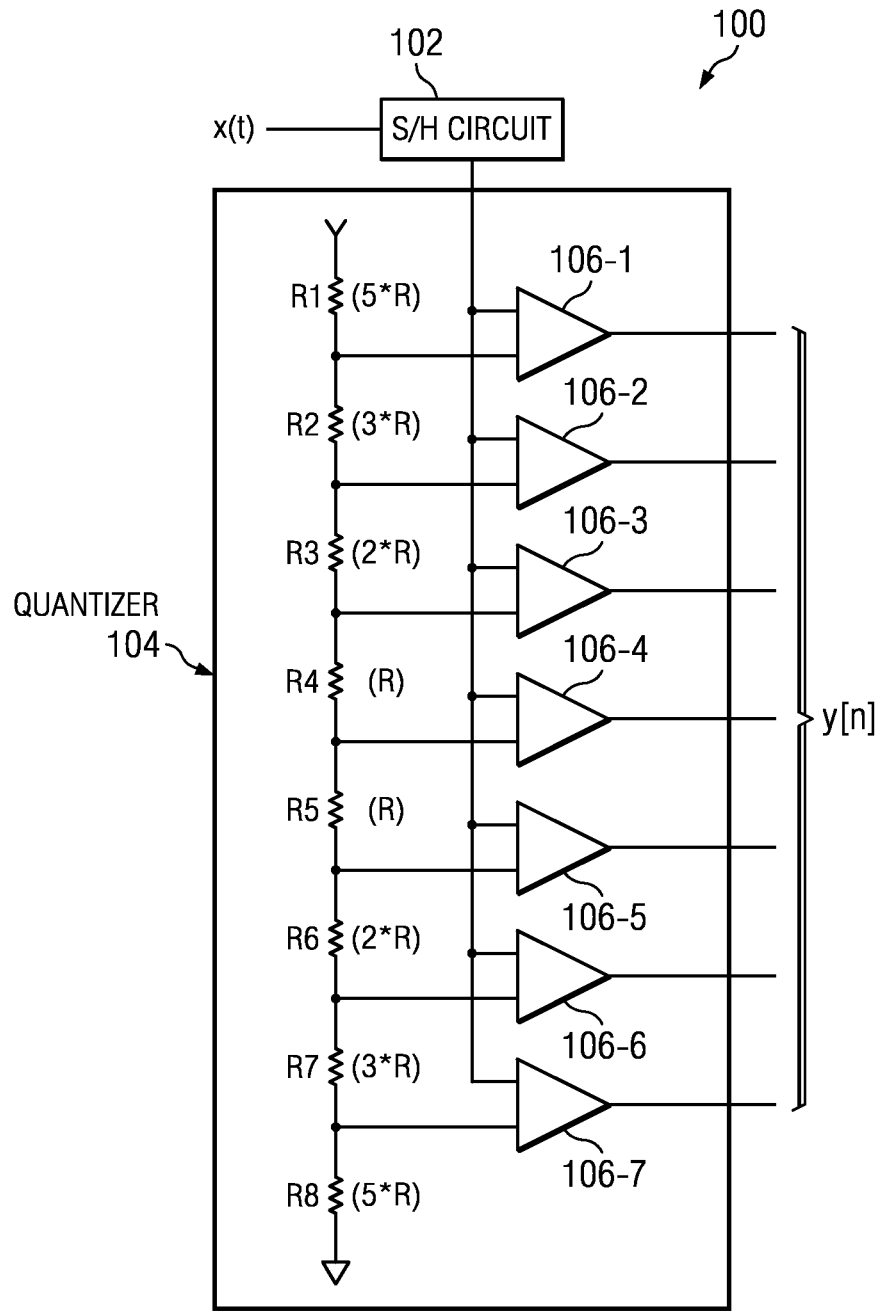
FIG. 1 is a diagram of an example of a conventional ADC employing a non-uniform quantizer.

Refer now to the drawings wherein depicted elements are, for the sake of clarity, not necessarily shown to scale and wherein like or similar elements are designated by the same reference numeral through the several views.

Figure 2:
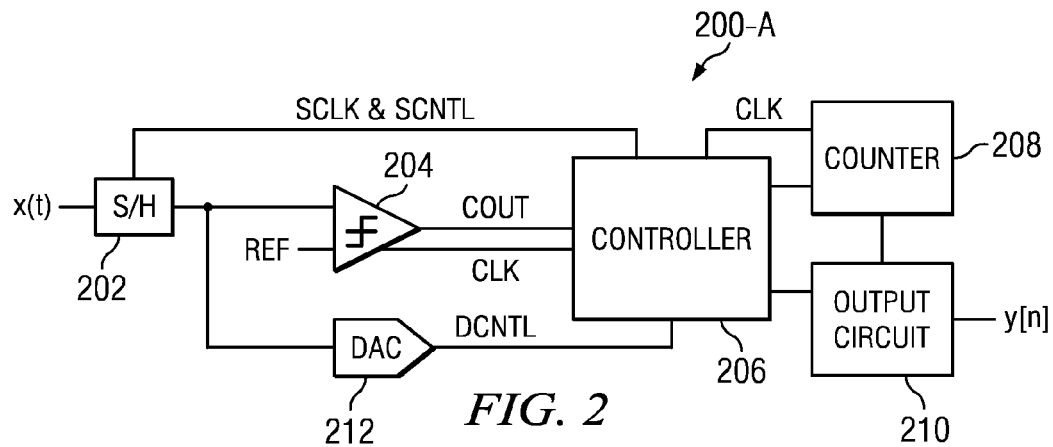
FIG. 2 is a diagram of an example of an ADC in accordance with an embodiment of the present invention.

Turning to FIG. 2, an example of a ADC 200-A in accordance with an embodiment of the present invention can be seen, where the ADC 100 generally functions as an "integrating" ADC. Preferably, the S/H circuit 202 samples an input signal x(t) at sampling instants set by the sample clock signal SCLK (which is generally provided by a timing circuit and/or controller 206), and this sample is provided on the output node or terminal of the S/H circuit 202. The DAC 212 applies a current (which is set by the control signal DCNTL from the controller 206) to the output node or terminal of the S/H circuit so as to change the voltage on this node. As the voltage on the output terminal of the S/H circuit 202 is changed from the sample voltage due to the current applied by the DAC 212, the comparator 204 (which is typically a latched comparator that is controlled by the clock signal CLK) compares this voltage to a reference voltage REF. When the voltage on this node or terminal reaches the reference voltage REF, comparator outputs a pulse (which is part of the output signal COUT) to the controller 206. As the voltage on the output terminal of the S/H circuit 202 is being changed from the sample voltage to the reference voltage REF, the counter 208 (using the clock signal) increments a count value to measure the interval over which the change in voltage takes place. The output circuit 210 is then able to generate a digital representation or digital output signal y[n] from the interval and applied current from DAC 212.

Figure 3:
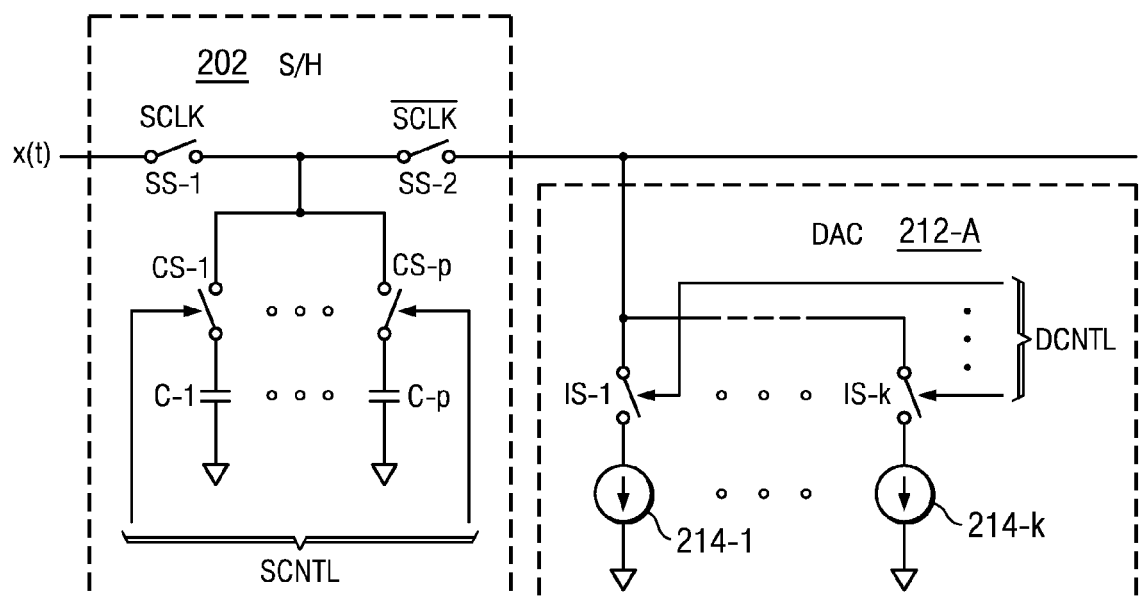
FIGS. 3 and 5 are diagrams showing examples of the S/H circuit and DAC of FIG. 2 in greater detail.

There are several ways in which the ADC 200-A can be implemented, and an example of a portion of one of these implementations can be seen in FIG. 3. Typically, the S/H circuit 202 employs a sample capacitor to store the value (voltage) of the sampled signal. Here, the S/H circuit 202 is represented by input and output switches SS-1 and SS-2 that are activated by the sample clock signal SCLK and its inverse, respectively, and several branches (i.e., p branches, as shown). As shown for the sake of simplicity, each of these branches generally includes a switch CS-1 to CS-p (which is controlled by the control signals SCNTL from controller 206) and a sample capacitor C-1 to C-p. By using this arrangement, multiple operations or data conversions can be performed on a sampled voltage or stored value. Additionally, DAC 212-A (which is a current steering DAC as shown) includes a number of branches (i.e., k branches) that each include a switch IS-1 to IS-k and current source 214-1 to 214-k. Based on the control signal DCNTL, the current applied to the output terminal of the S/H circuit 202 can be adjusted so as to discharge capacitor CS-1 to CS-p supplying the voltage this output terminal. By using this arrangement, ADC 200-A is able to make multiple measurements (i.e., two or more) for a single sample within a sample period using currents (i.e., two or more) of different magnitudes to achieve better accuracy. Also, this example does not function as a "true" integrating ADC because it discharges; however, it employs a similar principal.

Figure 4:
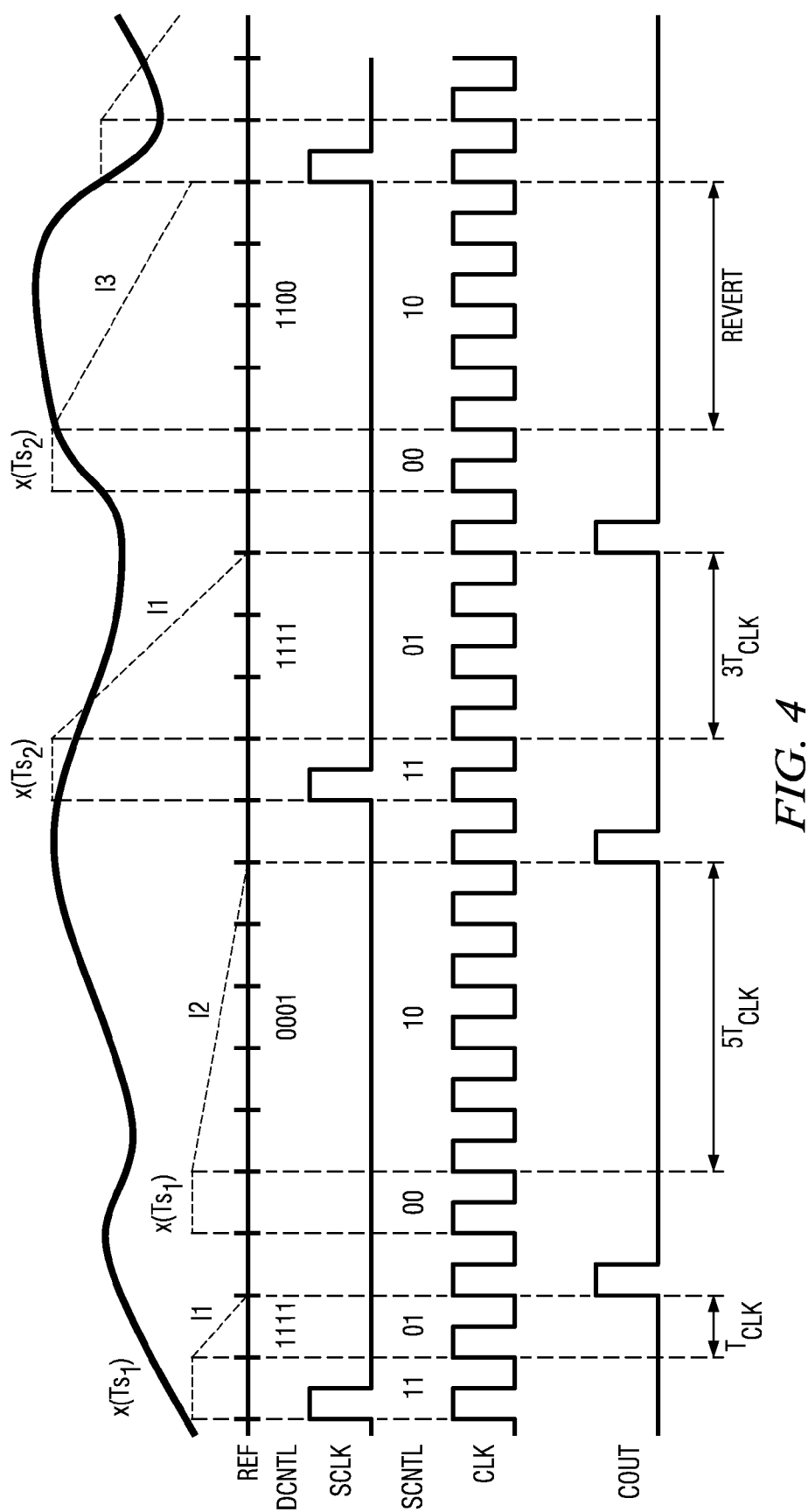
FIGS. 4 and 6 are diagrams of the operation of the ADC of FIG. 2 using the DACs of FIGS. 3 and 5, respectively.

Turning now to FIG. 4, an example of the operation of the ADC 100 using DAC 212-A can be seen. For this example, it can be assumed that there are 4 branches within DAC 212-A (i.e., k=4) and that there are 2 branches in S/H circuit 202 (i.e., p=2). For sampling instant $Ts_1$, the sample clock signal SCLK transitions to logic high or "1" for one-half of a period of the clock signal CLK (which activates switch SS-1 and deactivates switch SS-2), and, during period for the clock signal CLK corresponding to sampling instant $Ts_1$, the controller 206 issues a control signal SCNTL having a value of "11," meaning that switches CS-1 and CS-2 are activated or closed so as to charge capacitors CS-1 and CS-2 to sample voltage $x(Ts_1)$. Following the period for the clock signal CLK corresponding to sampling instant $Ts_1$, capacitor C-1 is coupled to the output terminal because the control signal SCNTL (which is "01") activates switch CS-1, and DAC 212-A applies current I1 (which corresponds to a control signal DCNAL of "1111" for this example) to the output terminal. As shown, 1 period of clock signal CLK ($T_{CLK}$) is used to discharge capacitor C-1 to the reference voltage REF (which is 0V in this example), outputting a crossing pulse on the output signal COUT. Because there are 10 periods $T_{CLK}$ between sampling instants, the controller 206 is able to resolve the sample voltage $x(Ts_1)$ with higher resolution within the sample period for sampling instant $Ts_1$. Subsequently, the controller 206 adjusts the current applied to the output terminal with the use of control signal DCNTL (which is "0001") so as to be current I2. The controller 206 then couples capacitor C-2 to the output node by closing switch CS-2 with control signal SCNTL (which is "10"). Current I2 discharges capacitor C-2 over 5 period $T_{CLK}$. Because the second measurement (i.e., $5T_{CLK}$ for current I2) has a higher resolution, the second measurement can be used to generate the digital output or digital representation y[n]. For the next sampling instant $Ts_2$, the same process is performed, but DAC 212-A (which applies a current I3 that corresponds to a control signal DCNTL of "1100") cannot discharge capacitor C-2 before the next sampling period begins. Thus, the first measurement (i.e., $3T_{CLK}$ for current I1) for sampling instant $Ts_2$ can be used to generate the digital representation for sample voltage $x(Ts_2)$. With this arrangement then, the overall accuracy of the ADC 200-A can be improved over other conventional implementations.

Figure 5:
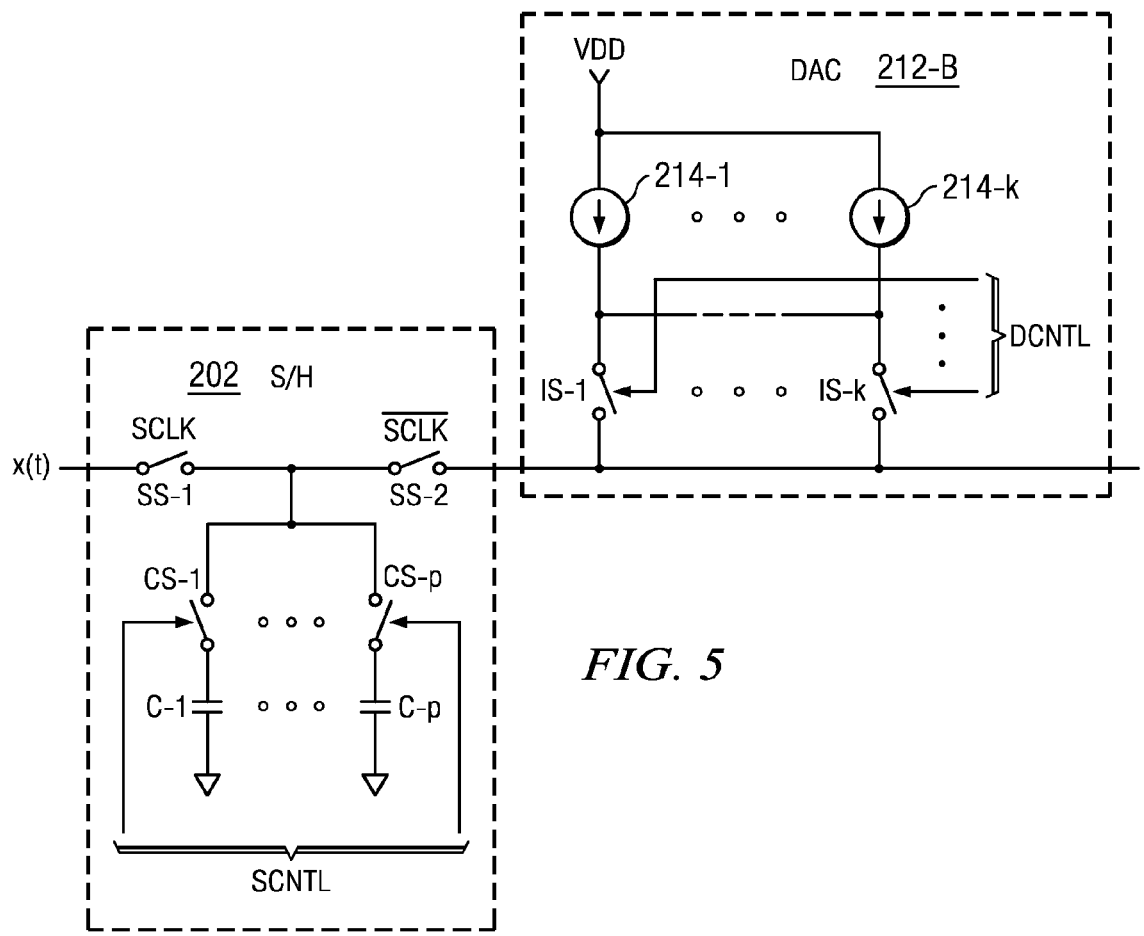

Alternatively, a true integrating ADC implementation can be employed. An example of such an implementation can be seen in FIG. 5, which shows DAC 212-B being used with the ADC 200-A. As shown, S/H circuit 202 and DAC 212-B of FIG. 5 have a similar configuration to S/H circuit 202 and DAC 212-A of FIG. 3. One difference, however, is that current sources 214-2 to 214-k charge the capacitors C-1 to C-p so as to "pull-up" the voltage on the output terminal to reference voltage REF, operating as a "true" integrating ADC. DAC 212-A can also be combined with DAC 212-B to perform both discharge and charge capacitors (i.e., CP-1) within S/H circuit 202 as another implementation.

Figure 6:
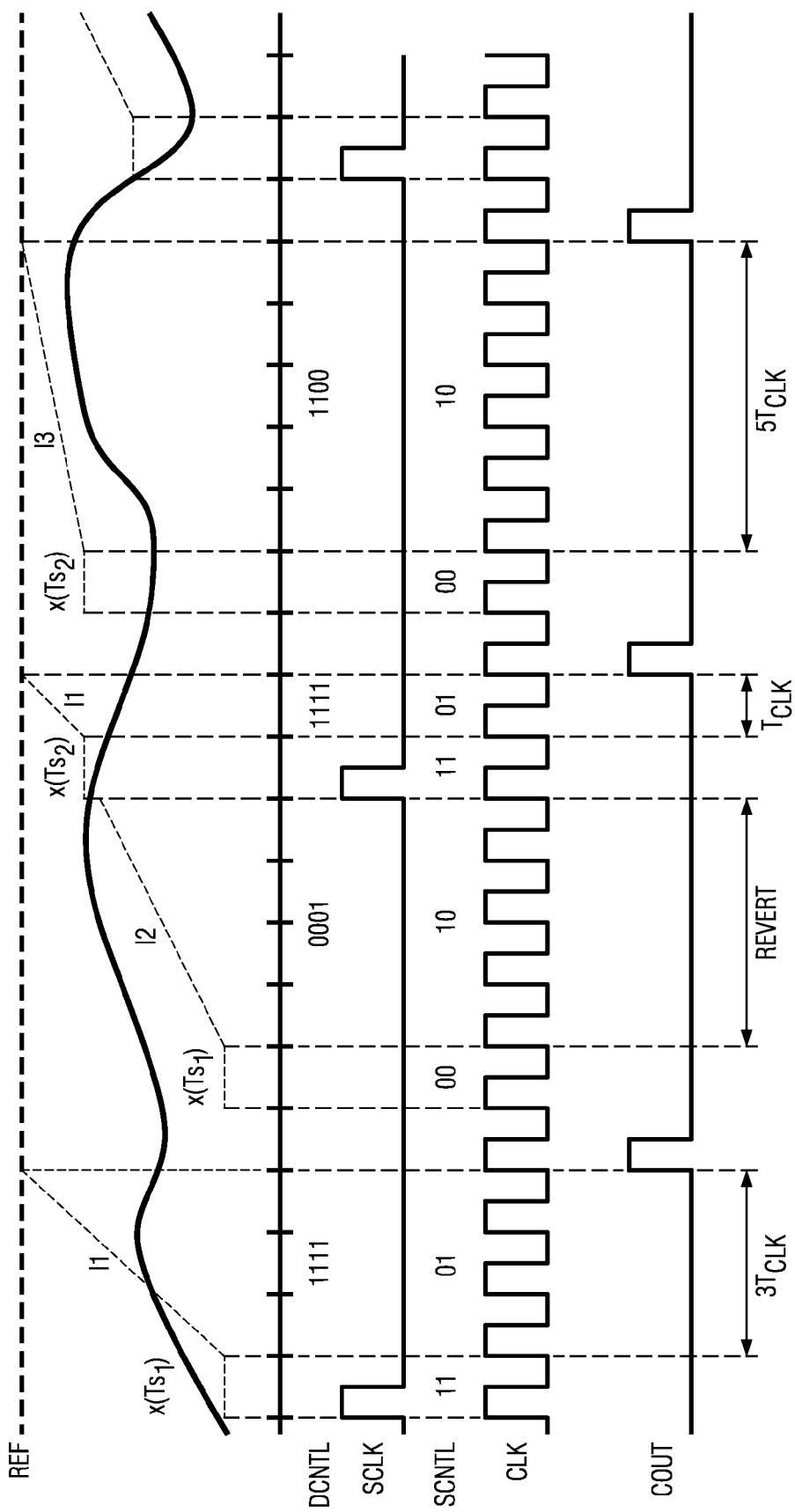

An example of the operation of ADC 200-A (which employs DAC 212-B) can be seen in FIG. 6, which uses the same assumptions as FIG. 4. ADC 200-A employing DAC 212-B functions in a similar manner to ADC 200-A employing DAC 212-A, but the reference voltage REF is different. For this example, it can be assume that the reference voltage is a positive voltage that is greater than the maximum expected input signal x(t) (i.e., 7V). Because the reference voltage REF is greater than the input signal x(t), ADC 200-A measures the interval over which the voltage on the output node or terminal reaches the reference voltage REF. (i.e., $3T_{CLK}$ for sample voltage $x(Ts_1)$ using current I1), providing a similar result as ADC 200-A employing DAC 212-A.

Figure 7:
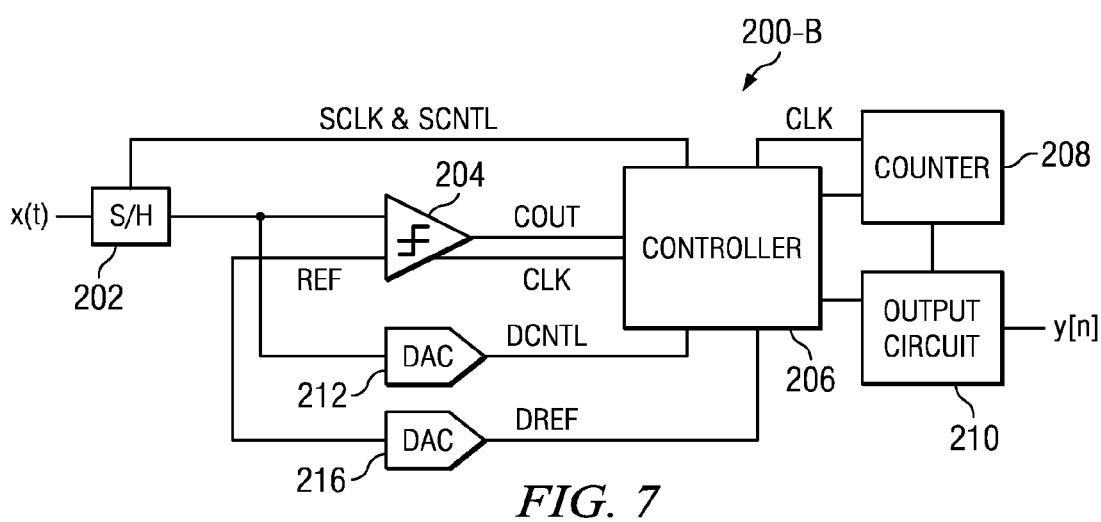
FIG. 7 is a diagram of an example of an ADC in accordance with an embodiment of the present invention.

Turning to FIG. 7, another example of an ADC 200-B that employs a non-uniform quantizer can be seen. ADC 200-A is similar in construction to ADC 200-B, having the same functionality, except that the quantizer of ADC 200-B includes DAC 216. This DAC 216 (which is typically controlled by the control signal DREF from controller 206) is generally used to adjust the reference voltage REF to capture smaller voltage swings. Presumably, the voltage of input signal x(t) at each sampling instant (i.e., $TS_2$) will be "close" to the voltage of the input signal x(t) at a previous sampling instant (i.e., $TS_1$), or the voltage of input signal x(t) at each sampling instant (i.e., $TS_3$) can be predicted from a set of previous samples (i.e., $TS_1$ and $TS_2$). Controller 206 can include a predictor or can include a predictive algorithm implemented on a processor with a storage medium that can use digital representations of previous sample voltages (i.e., $x(Ts_2)$) to make adjustments to the reference voltage REF. For example, a slope can be calculated from the digital representations of two previous samples. Other alternative algorithms may also be employed.

Figure 8:
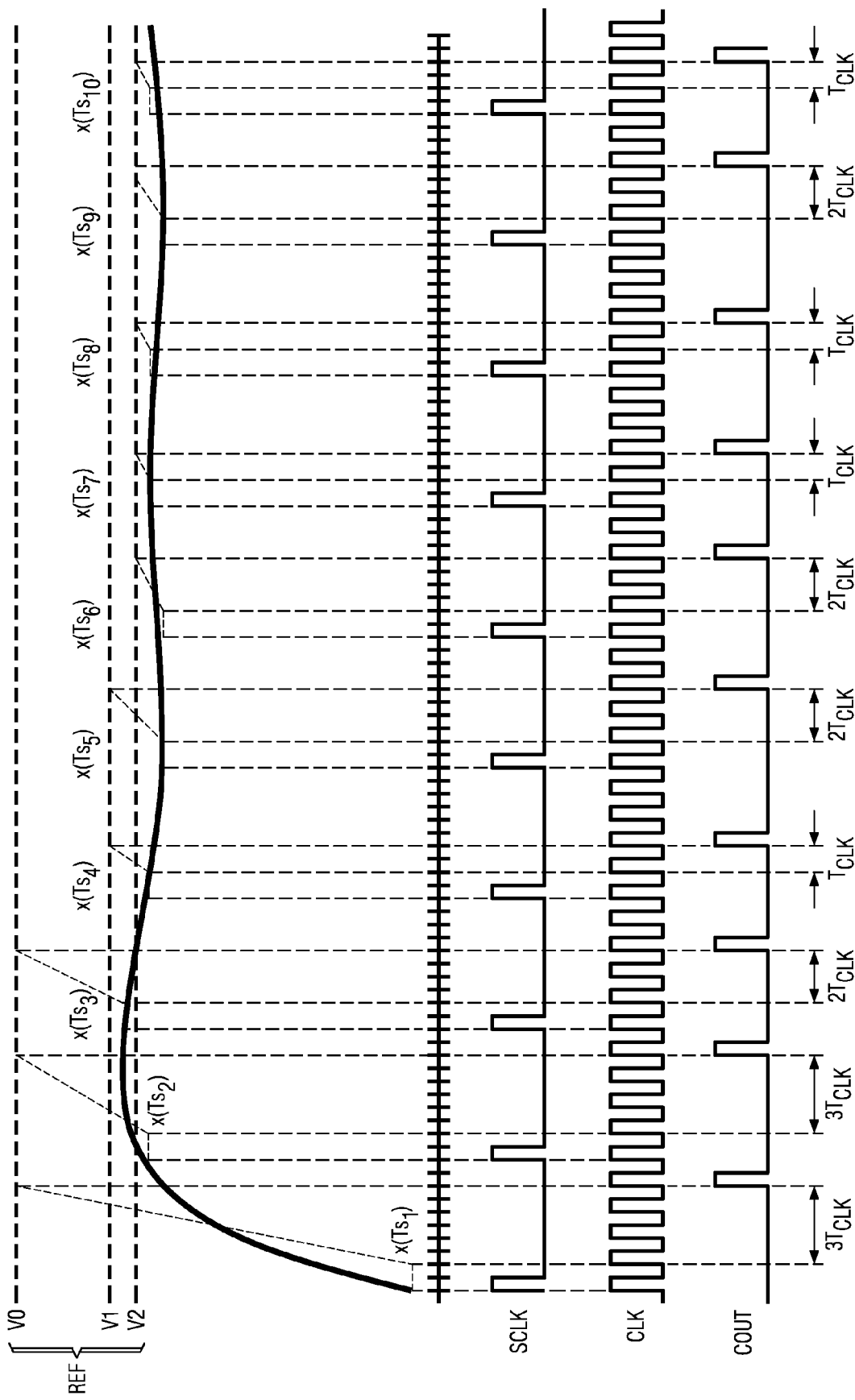
FIG. 8 is a diagram of the operation of the ADC of FIG. 7 using the DAC of FIG. 5.

In FIG. 8, an example of the operation of the ADC 200-B can be seen. For the sake of simplicity of explanation in this example, DAC 212-B is shown as applying generally constant current, but the conversion process described above may be used. As shown, the input signal x(t) varies dramatically (having a large voltage swing) between sampling instants $Ts_1$ and $Ts_2$ and varies slightly between sampling instant $Ts_2$ and $Ts_{10}$ (having a small voltage swing). Thus, it is desirable to lower the reference voltage REF to achieve higher resolution for sampling instant $Ts_2$ through $Ts_{10}$. Initially, controller 206 sets the reference voltage to voltage V0 (which may be a default voltage) to perform the integrating data conversion (as described above) for sample voltages $x(Ts_1)$ through $x(Ts_3)$. Because there is a small difference between $x(Ts_2)$ through $x(Ts_3)$, the controller 206 through control signal DREF lowers the reference voltage REF to voltage V1. The reference voltage REF is also lowered to voltage V2 for sampling instant $Ts_6$. Thus, ADC 200-B is able to achieve higher granularity for lower voltage swings at sub-Nyquist sampling rates.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a sample-and-hold (S/H) circuit that is configured to generate a sample voltage from an input signal, wherein the S/H circuit is controlled by a sample clock signal;
   a digital-to-analog converter (DAC) that is coupled to an output terminal of the S/H circuit so as to apply at least one of a plurality of applied currents to the output terminal of the S/H circuit;
   a comparator that is coupled to the output terminal and that receives a reference voltage;
   a counter that is configured to determine the length of a first interval over which a first voltage on an output terminal of the S/H circuit changes from the sample voltage to the reference voltage using a first applied current of the plurality of applied currents from the DAC; and
   a controller that is coupled to the comparator, the DAC, the counter, and the S/H circuit, wherein the controller provides the sample clock signal to the S/H circuit, and wherein the controller provides a clock signal to the counter, and wherein the controller is configured to adjust the DAC to provide a second applied current after the first voltage on the output terminal of the S/H circuit reaches the reference voltage, and wherein the counter, during a sample period of the sample clock associated with the sample voltage, is configured to determine the length of a second interval over which a second voltage on the output terminal of the S/H circuit changes from the sample voltage to the reference voltage using the second applied current of the plurality of applied currents from the DAC.

2. The apparatus of claim 1, wherein the S/H circuit further comprises a plurality of sampling branches, wherein each sampling branch is coupled to the output terminal of the S/H circuit, is controlled by a sample control signal from the controller, and has a sampling capacitor.

3. The apparatus of claim 2, wherein the DAC further comprises:
   a plurality of switches, wherein each switch is coupled to the output terminal of the S/H circuit, and wherein each switch is controlled by the controller; and
   a plurality of current sources, wherein each current source is coupled to at least one of the switches.

4. The apparatus of claim 3, wherein the plurality of current sources are configured to discharge the sampling capacitors.

5. The apparatus of claim 3, wherein the plurality of current sources are configured to charge the sampling capacitors.

6. The apparatus of claim 3, wherein the apparatus further comprises a output circuit that is coupled to the controller.

7. The apparatus of claim 6, wherein the controller provides the clock signal to the comparator.

8. An apparatus comprising:
   an S/H circuit that is configured to generate a plurality of sample voltages from input signal at a plurality of sampling instants, wherein the S/H circuit is controlled by a sample clock signal;
   a DAC that is coupled to an output terminal of the S/H circuit so as to apply at least one of a plurality of currents to the output terminal of the S/H circuit;
   a comparator that is coupled to the output terminal and that receives a reference voltage;
   a counter that is configured to determine the lengths of intervals over which voltages on an output terminal of the S/H circuit change to the reference voltage from each sample voltage; and
   a controller that is coupled to the comparator, the DAC, the counter, and the S/H circuit, and wherein the controller provides a clock signal to the counter, and wherein the controller is configured to adjust the reference voltage for a subsequent sample voltage based at least in part on a current sample voltage.

9. The apparatus of claim 8, wherein the DAC further comprises a first DAC, and wherein the apparatus further comprises a second DAC that is coupled between the controller and the comparator and that provides the reference voltage to the comparator.

10. The apparatus of claim 8, wherein the S/H circuit further comprises a sampling capacitor.

11. The apparatus of claim 10, wherein the first DAC further comprises:
    a plurality of switches, wherein each switch is coupled to the output terminal of the S/H circuit, and wherein each switch is controlled by the controller; and
    a plurality of current sources, wherein each current source is coupled to at least one of the switches.

12. The apparatus of claim 11, wherein the plurality of current sources are configured to discharge the sampling capacitor.

13. The apparatus of claim 11, wherein the plurality of current sources are configured to charge the sampling capacitor.

14. The apparatus of claim 11, wherein the controller adjusts the reference voltage for a subsequent sample voltage based at least in part on a slope of the two previous sample voltages.

15. A method comprising:
    sampling an input signal at a sampling instant to generate a sample voltage;
    applying a first current to a node to change a voltage on the node;
    determining a first interval to change the voltage on the node to a reference voltage from the sample voltage using the first current;
    applying a second current to the node to change a voltage on the node prior to a subsequent sampling instant; and
    determining a second interval to change the voltage on the node to the reference voltage from the sample voltage using the second current.

16. The method of claim 15, wherein the method further comprises:
    storing the sample voltage on a first and second capacitors;
    coupling the first capacitor to the node prior to the step of applying the first current; and
    coupling the second capacitor the node prior to the step of applying the second current.

17. The method of claim 16, wherein the step of determining the first interval further comprises incrementing a first count value using a clock signal until the voltage on the node reaches the reference voltage, and wherein the step of determining the second interval further comprises incrementing a second count value using the clock signal until the voltage on the node reaches the reference voltage.

18. The method of claim 17, wherein the method further comprises:
    converting the second count value to a digital representation of the sample voltage if the voltage on the node reaches the reference voltage using the second current before a subsequent sampling instant; and converting the first count value to the digital representation of the sample voltage if the voltage on the node does not reach the reference voltage using the second current before the subsequent sample.

19. The method of claim 18, wherein the first and second currents discharge the first and second capacitors to the reference voltage, respectively.

20. The method of claim 18, wherein the first and second currents charge the first and second capacitors to the reference voltage, respectively.

21. A method comprising:
sampling an input signal at a sampling instant to generate a sample voltage;
applying a current to a node to change a voltage on the node;
determining an interval to change the voltage on the node to a reference voltage from the sample voltage using the current; and
adjusting the reference voltage for a subsequent sample based at least in part on the interval,
wherein the method further comprises:
storing the sample voltage on a capacitor; and
coupling the capacitor to the node prior to the step of applying the current.
wherein the step of determining the interval further comprises incrementing a first count value using a clock signal until the voltage on the node reaches the reference voltage.

22. The method of claim 21, wherein the method further comprises converting the count value to a digital representation of the sample voltage.

23. The method of claim 22, wherein the step of adjusting further comprises:
calculating a slope between the sample voltage and a previous sample; and
adjusting the reference voltage for the subsequent sample based at least in part on the slope.

24. The method of claim 23, wherein the first and second currents discharge the first and second capacitors to the reference voltage, respectively.

25. The method of claim 23, wherein the first and second currents charge the first and second capacitors to the reference voltage, respectively.

* * * * *